(12) United States Patent
Germana

(10) Patent No.: US 7,012,309 B2
(45) Date of Patent: Mar. 14, 2006

(54) HIGH-VOLTAGE INTEGRATED CMOS CIRCUIT

(75) Inventor: Rosalia Germana, Antibes (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/480,911

(22) PCT Filed: Jun. 14, 2002

(86) PCT No.: PCT/FR02/02063

§ 371 (c)(1),
(2), (4) Date: Jan. 13, 2004

(87) PCT Pub. No.: WO02/103797

PCT Pub. Date: Dec. 27, 2002

(65) Prior Publication Data

US 2004/0183138 A1    Sep. 23, 2004

(30) Foreign Application Priority Data

Jun. 15, 2001   (FR) .................................. 01 07871

(51) Int. Cl.
*H01L 29/76* (2006.01)

(52) U.S. Cl. ..................... 257/372; 257/376; 257/409

(58) Field of Classification Search ................ 257/369, 257/371, 372, 373, 376, 394, 395, 398, 400, 257/519, E27.063, E27.067, E27.066, E21.63, 257/E21.632, 374, 409, 491, 399
See application file for complete search history.

(56) References Cited

U.S. PATENT DOCUMENTS

| 4,761,384 | A | | 8/1988 | Neppl et al. | |
|---|---|---|---|---|---|
| 5,206,535 | A | * | 4/1993 | Namose | 257/519 |
| 5,545,911 | A | * | 8/1996 | Otsuki et al. | 257/376 |
| 5,631,178 | A | | 5/1997 | Vogel et al. | |
| 6,198,139 | B1 | * | 3/2001 | Ishida | 257/372 |

OTHER PUBLICATIONS

Search Report from French priority application No. 01/07871, filed Jun. 15, 2001.
Patent Abstracts of Japan vol. 006, No. 200 (E-135), Oct. 9, 1982 & JP 57 107068.
Patent Abstracts of Japan vol. 016, No. 279 (E-1220), Jun. 22, 1992 & JP 04 068564.
Patent Abstracts of Japan vol. 010, No. 129 (E-403), May 14, 1986 & JP 60 260144.
Patent Abstracts of Japan vol. 014, No. 105 (E-0895), Feb. 26, 1990 & JP 01 308067.

* cited by examiner

*Primary Examiner*—Tom Thomas
*Assistant Examiner*—Matthew C Landau
(74) *Attorney, Agent, or Firm*—Lisa K. Jorgenson; James H. Morris; Wolf, Greenfield & Sacks, P.C.

(57) ABSTRACT

The invention relates to an integrated CMOS circuit comprising, in a semiconductor substrate (1) with a first type of conductivity, a casing (2) of a second type of retrograde-doped conductivity, the end of said casing being covered by an inter-casing insulating region (4). The components contained in said casing are separated from each other by means of intra-casing insulating regions (6,7). The first insulating elements (15) of the second type of high-level doping conductivity extend under each intra-casing insulating region. A second region (21) of the second type of high-level doping conductivity partially extends under the inter-casing insulator beyond the periphery of each casing.

9 Claims, 2 Drawing Sheets

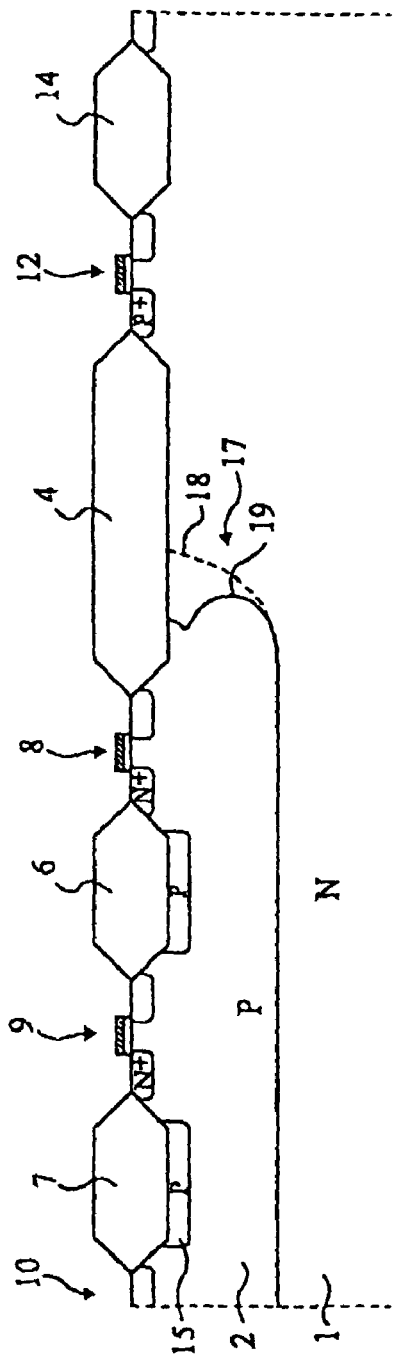
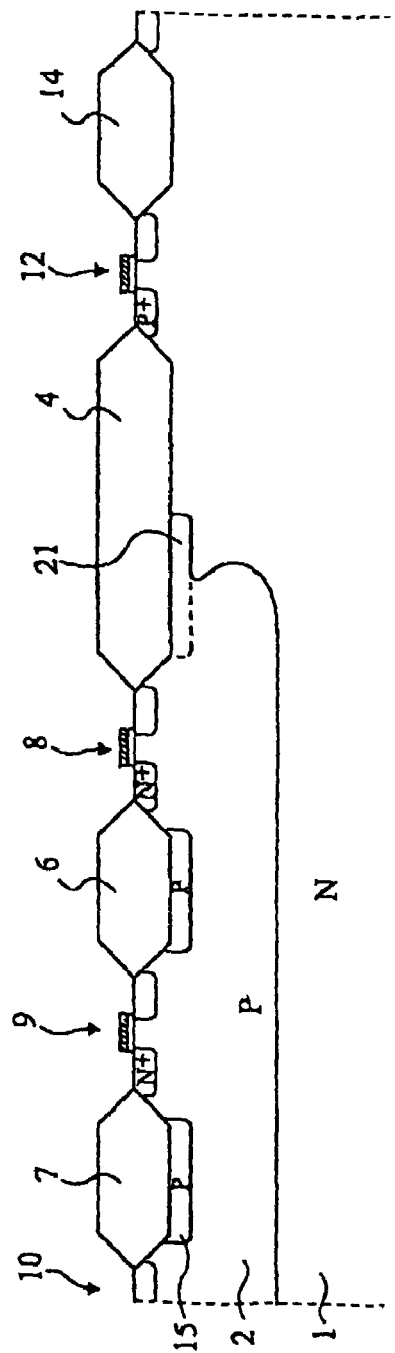
Fig 1 (Prior Art)
Fig 2

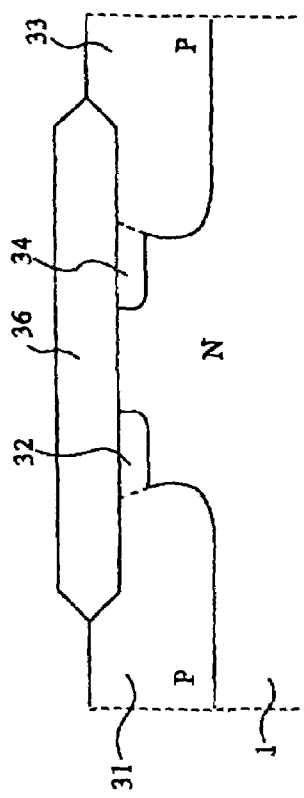
Fig 3
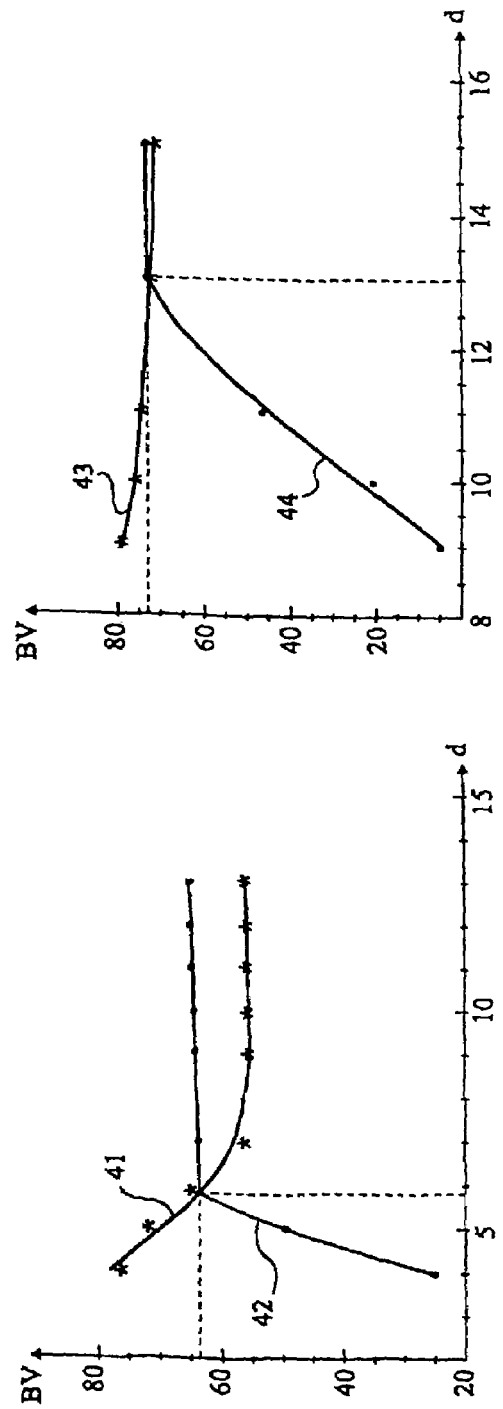
Fig 5
Fig 4 (PRIOR ART)

HIGH-VOLTAGE INTEGRATED CMOS CIRCUIT

BACKGROUND OF THE INVENTION

1. Field of the Invention

The present invention relates to the manufacturing of a CMOS-type integrated circuit.

2. Discussion of the Related Art

In a CMOS-type integrated circuit, various components are formed within properly doped wells. The substrate is of a first conductivity type, for example, an N-type epitaxial layer laid on an $N^+$-type wafer, and wells having a conductivity type opposite to that of the substrate, for example P wells, will more specifically be considered herein in the case where they have a retrograde doping. A retrograde doping well is a well formed by a succession of at least one deep implantation at a high doping level and at least one shallower implantation at a lower concentration. Such structures have the advantage of reducing the necessary thermal processings and limiting the gain of vertical parasitic transistors.

An example of such a structure is illustrated in FIG. 1. A lightly-doped N-type substrate 1 is formed, for example, of an epitaxial layer formed on a heavily-doped N-type silicon wafer. In this substrate is formed a P-type well 2 with a retrograde doping. The periphery of well 2 is defined by an insulating area 4 located at the surface of epitaxial layer 1. This insulating area may be a thick oxide layer resulting from the manufacturing method commonly known as the LOCOS method. However, any other method for forming an insulating peripheral layer, for example, digging and filling up of a trench, may be used. Insulating area 4 will here be called the inter-well insulating area.

In well 2, active areas 8, 9, 10 within which semiconductor components can be formed are defined by thick oxide regions 6, 7, here called intra-well insulating areas. In the drawing, an N-channel MOS type transistor has been shown in each of these regions. As the structure of these components is not the object of the present invention, said components are shown extremely schematically and will not be described in detail, but those skilled in the art will know how to form such components in various ways and with various structure alternatives.

Outside of the perimeter defined by inter-well oxide area 4, are present other elements of a circuit formed in the silicon wafer. These may be other P wells or, as shown, P-channel MOS-type transistors 12 directly formed in epitaxial layer 1 and delimited by other intra-well insulating regions such as region 14. These may also be components formed in N-type wells specifically doped to optimize components to be formed therein.

P-type doped areas 15, conventionally called insulation implantations, formed under each of intra-well insulating areas 6, 7, have also been shown in FIG. 1. Insulation implantations 15 are conventionally formed before insulating regions 6, 7 by implantation at a relatively high doping level, to result in regions having a surface doping level on the order of from $10^{17}$ to $10^{18}$ atoms/cm³. Insulation implantations 15 aim at avoiding creation of lateral parasitic transistors which would for example have a source corresponding to the drain of a transistor on one side of insulating region 7, a drain corresponding to the source of a transistor on the other side of insulating region 7, and a channel corresponding to the upper portion of the P-type well under the insulating region. Such a parasitic transistor could be started by a voltage applied to a metallization running over insulating region 7. Providing an insulation implantation 15 having a relatively high doping level avoids turning on such a parasitic transistor.

As indicated previously, within wells 2, the choice of a structure of retrograde type enables optimizing many operating parameters of the components, especially reducing the action of vertical parasitic transistors.

However, such retrograde-type wells appear in practice to have a smaller breakdown voltage in reverse biasing, that is, when well P is negatively charged with respect to substrate 1, than conventional wells in which the doping level progressively decreases from the upper surface to the lower area of the well. It is generally considered that this reduced breakdown voltage results from the shape of the periphery of the junction in the area designated by reference 17 and schematically shown in FIG. 1. Instead of a junction having the regular shape designated with reference 18 corresponding to a conventional well, the case of a retrograde doping provides a shape in which the periphery of the P well protrudes in a hump 19 below the surface of the semiconductor wafer. This hump directly results from the way in which a retrograde implantation is performed. Indeed, given that a heavily-doped deep implantation has first been performed before a shallower more lightly-doped implantation, the deep portion in which the implantation has been performed with a higher doping level will have the greatest lateral extent. It can be understood that given this shape of the junction periphery, in reverse biasing, the field lines will tend to curve back and tighten up, which results in a reduction in the breakdown voltage.

Various solutions are known to improve this breakdown voltage. A first solution consists of forming above insulating area 4 a field plate, that is, a conductive area connected to the voltage of the well which takes part in the spreading of the field lines when the device is reverse-biased. This solution has a limited efficiency and does not, by itself sufficiently increase the breakdown voltage. It is generally adopted as a complement to other solutions.

Another solution consists of forming at the periphery of well 2, under insulating layer 4, a more lightly-doped ring, deeper than the well. This solution is efficient but requires implementing additional technological steps. It can thus not be adopted when the manufacturing cost of a component is desired to be lowered.

SUMMARY OF THE INVENTION

Thus, an object of the present invention is to provide a novel retrograde well periphery structure that improves the reverse breakdown voltage of this well. The present invention aims at achieving this object without increasing the manufacturing cost of a component and without increasing the number of technological steps necessary to its implementation.

To achieve this and other objects, the present invention provides a CMOS-type integrated circuit including, in a semiconductor substrate of a first conductivity type, a well of the second conductivity type with a retrograde doping, the limit of said well being covered with an inter-well insulating area, the components contained in said well being separated from one another by intra-well insulating areas, first insulation regions with a high doping level of the second conductivity type extending under each intra-well insulating area. A second region with a high doping level of the second conductivity type, identical to the first regions, partially extends under the inter-well insulator beyond the periphery of each well.

According to an embodiment of the present invention, the amount by which the second region laterally protrudes from the well is of the same order of magnitude as the well depth.

According to an embodiment of the present invention, the substrate is a lightly-doped epitaxial layer formed on a more heavily-doped single-crystal silicon wafer of the first conductivity type.

According to an embodiment of the present invention, the maximum doping level in the depth of the retrograde well is on the order of from $10^{17}$ to $10^{18}$ atoms/cm$^3$ and the surface doping level of the second region is of the same order of magnitude.

The foregoing objects, features and advantages of the present invention, will be discussed in detail in the following non-limiting description of specific embodiments in connection with the accompanying drawings, wherein:

BRIEF DESCRIPTION OF THE DRAWINGS

FIG. 1 shows a conventional CMOS-type structure with a retrograde well;

FIG. 2 shows a CMOS-type structure with a retrograde well according to the present invention;

FIG. 3 shows the limiting area between two P wells in the structure according to the present invention;

FIG. 4 shows the shape of the breakdown voltage between two P wells and between a well and the substrate according to prior art;

FIG. 5 shows the shape of the breakdown voltage between two P wells and between a well and the substrate according to the present invention.

DETAILED DESCRIPTION

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

FIG. 2 shows same elements as in FIG. 1 having the same reference characters. These elements will not be described again. The difference between the structures according to the present invention shown in FIG. 2 and the prior art structure shown in FIG. 1 is the structure of the area peripheral to the well. As previously, this periphery extends under a thick oxide inter-well area 4. Well 2 is a retrograde well formed in the same way as described in relation with FIG. 1. However, under a portion of insulating inter-well 4, a P-type region 21 has been implanted. Region 21 is formed at the same time as insulation implantations 15 formed under insulating intra-well areas 6 and 7. Region 21 is formed to protrude from the well periphery by a chosen amount. In practice, a protrusion on the order of from 2.5 to 5 µm, that is, of the same order of magnitude as the well depth, appears, with the orders of magnitude which will be given hereafter, to be sufficient to achieve the breakdown voltages of the same order of magnitude as the voltages which would be achieved with conventionally-formed wells, that is, wells having a doping level which regularly decreases from the surface to the inside of a semiconductor wafer.

As an example, a CMOS-type structure in which the channel lengths are much smaller than 1 µm, for example, 0.35 µm, is considered. It is then considered that well P has a depth smaller than 3 µm, with a doping peak resulting from a deep implantation located at a depth slightly smaller than 2 µm and with a maximum doping concentration on the order of from $10^{17}$ to $10^{18}$ atoms/cm$^3$. With a conventional retrograde structure such as illustrated in FIG. 1, the reverse breakdown voltage would be on the order of 60 volts. With a structure according to the present invention, a breakdown voltage on the order of 77 volts is obtained if extension 21 according to the present invention protrudes by approximately 3 µm with respect to the normal well periphery and a voltage greater than 80 volts is obtained as soon as this value exceeds 5 µm. Of course, the structure according to the present invention may also be associated with field plates, as previously mentioned.

The case of the breakdown voltage in an area included between two P wells will now more specifically be considered. Such a structure is schematically shown in FIG. 3. A first retrograde P well 31 is formed to the left of the drawing and includes a junction extension 32 formed of a heavily-doped shallow P-type insulation implantation. To the right of the drawing appears a second P well of retrograde type 33 also provided with a relatively heavily-doped P-type peripheral extension 34. The limits of the two wells extend from an insulating inter-well layer, currently made of thick oxide, 36.

FIG. 4 illustrates breakdown voltages BV according to the distance d between the two wells 31 and 33, when regions 32 and 34 according to the present invention are not provided. Curve 41 shows the reverse biasing breakdown voltage between a well and the substrate (epitaxial layer 1) and curve 42 shows the breakdown voltage between two wells biased in opposite ways. The ordinates (BV) represent the breakdown voltage in volts and the abscissas represent distance d between two wells in µm. Curve 41 shows that the well-substrate breakdown voltage decreases as the distance between wells increases. Conversely, curve 42 shows that the breakdown voltage between wells increases as the distance between the wells increases. In the example shown, and for the chosen doping levels, it can be seen that the optimal compromise corresponds to a distance between wells on the order of 6 µm and that the breakdown voltage then ranges between 60 and 65 volts.

In FIG. 5, curves 43 and 44 respectively correspond to curves 41 and 42 in the case where well extension regions 32 and 34 such as illustrated in FIG. 3 have been provided. The conditions are the same as those of FIG. 4. The well extensions have an extent on the order of 3 µm. The curves have the same general shape as those of FIG. 4, but it should be noted that the breakdown voltage for the ideal compromise is now between 70 and 75 volts. The optimal distance is on the order of 13 µm between the wells, that is, approximately 7 µm between the ends of the junction extensions according to the present invention.

It should further be noted that the structure according to the present invention has an additional advantage to be added to the fact that the breakdown voltage is increased: in the vicinity of the optimal area, the breakdown voltages, be it for the well-well breakdown voltage or for the well-substrate breakdown voltage, vary much more smoothly, that is, the setting is much less critical.

Thus, the present invention enables increasing the well-substrate and well-well breakdown voltage in a CMOS integrated circuit structure with a retrograde well and this can be performed without complicating the manufacturing process since the only modification is a modification of the mask of the insulation implantations. While, in prior art, these implantations would only exist under the intra-well insulating areas, it is additionally provided according to the present invention to form these doped areas also at the periphery of the P wells, under the inter-well insulating area.

Of course, the present invention is likely to have various alterations, modifications, and improvements which will readily occur to those skilled in the art. Although it has been specifically described in the case of P wells, it can also apply in the case where all conductivity types are inverted, that is, in the case of an N well formed in a P-type epitaxial layer.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is be way of example only and is not as limiting. The invention is limited only as defined in the following claims and the equivalents thereto.

What is claimed is:

1. A CMOS-type integrated circuit including, in a semiconductor substrate of a first conductivity type, a well of the second conductivity type with a retrograde doping, a limit of said well being covered with an inter-well insulating area, the well having components contained therein, the components being separated from one another by intra-well insulating areas, the integrated circuit further including first insulation regions with a high doping level of the second conductivity type extending under each intra-well insulating area, wherein a second region with a high doping level of the second conductivity type, identical to the first regions, partially extends under the inter-well insulating area beyond a periphery of the well without reaching a neighboring well.

2. The CMOS integrated circuit of claim 1, wherein an amount by which the second region laterally protrudes from the well is of the same order of magnitude as a depth of the well.

3. The CMOS integrated circuit of claim 1, wherein the substrate is a lightly-doped epitaxial layer formed on a more heavily-doped single-crystal silicon wafer of the first conductivity type.

4. The CMOS integrated circuit of claim 1, wherein a maximum doping level in the depth of the retrograde well is on the order of from $10^{17}$ to $10^{18}$ atoms/cm$^3$ and a surface doping level of the second region is of the same order of magnitude.

5. A CMOS-type integrated circuit, comprising:
a substrate of a first conductivity type;
at least one well, disposed in the substrate, of a second conductivity type, the at least one well having a retrograde doping and a periphery,
a plurality of components disposed in the at least one well;
at least one intra-well insulating area disposed between adjacent ones of the plurality of components in the at least one well;
at least one first insulation region extending under each intra-well insulating area, the at least one first insulation region having a first high doping level of the second conductivity type;
an inter-well insulating area that covers at least a portion of the periphery of the at least one well; and
a second region that partially extends under the inter-well insulating area beyond the periphery of the at least one well, the second region having a second high doping level of the second conductivity type;
wherein the at least one well comprises a plurality of wells;
wherein the plurality of wells comprises at least first and second neighboring wells, and wherein the second region of the first well does not extend to the second well.

6. The CMOS-type integrated circuit of claim 5, wherein the first high doping level equals the second high doping level.

7. The CMOS-type integrated circuit of claim 5, wherein the well has a depth, and wherein an amount by which the second region laterally extends beyond the periphery of the well is of the same order of magnitude as the well depth.

8. The CMOS-type integrated circuit of claim 5, wherein the substrate is a lightly-doped epitaxial layer formed on a more heavily-doped single-crystal silicon wafer of the first conductivity type.

9. The CMOS-type integrated circuit of claim 5, wherein a maximum doping level in a depth of the retrograde well is on the order of $10^{17}$ to $10^{18}$ atoms/cm$^3$ and a surface doping level of the second region is of a same order of magnitude as the maximum doping level.

* * * * *